United States Patent
Wickramanayaka et al.

(10) Patent No.: US 10,249,593 B2
(45) Date of Patent: Apr. 2, 2019

(54) METHOD FOR BONDING A CHIP TO A WAFER

(71) Applicant: Agency for Science, Technology and Research, Singapore (SG)

(72) Inventors: Sunil Wickramanayaka, Singapore (SG); Ling Xie, Singapore (SG); Jerry Jie Li Aw, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 15/310,684

(22) PCT Filed: Jun. 22, 2015

(86) PCT No.: PCT/SG2015/050173
§ 371 (c)(1),
(2) Date: Nov. 11, 2016

(87) PCT Pub. No.: WO2015/195052
PCT Pub. Date: Dec. 23, 2015

(65) Prior Publication Data
US 2017/0084570 A1   Mar. 23, 2017

(30) Foreign Application Priority Data

Jun. 20, 2014   (SG) .............................. 10201403487P

(51) Int. Cl.
*H01L 23/00*   (2006.01)
*H01L 25/00*   (2006.01)
*H01L 25/065*   (2006.01)

(52) U.S. Cl.
CPC .............. *H01L 24/81* (2013.01); *H01L 24/03* (2013.01); *H01L 24/05* (2013.01); *H01L 24/11* (2013.01);
(Continued)

(58) Field of Classification Search
CPC .......... H01L 24/81; H01L 24/13; H01L 24/05; H01L 25/0657; H01L 25/50;
(Continued)

(56) References Cited

U.S. PATENT DOCUMENTS

| 5,468,655 A | 11/1995 | Greer |
| 2004/0173372 A1 | 9/2004 | Suda |

(Continued)

FOREIGN PATENT DOCUMENTS

WO   WO-2014/040423 A1   3/2014

OTHER PUBLICATIONS

International Search Report for PCT/SG2015/050173, 4 pages (dated Sep. 7, 2017).

(Continued)

*Primary Examiner* — Thanh Y Tran
(74) *Attorney, Agent, or Firm* — Choate, Hall & Stewart LLP

(57) ABSTRACT

A method for chip on wafer bonding is provided. The method includes the formation of a plurality of posts on at least one of a chip and a wafer, and a like plurality of contacts on the other of the chip and the wafer. After formation, a contact surface of each post is planarized, the respective planarized contact surface having a surface roughness height. A bonding material is then applied to at least one of the chip in a thickness no greater than the surface roughness height of the contact surface. The posts are then temporarily bonded to the contacts using the bonding material to stabilize a position of the chip relative to the wafer for permanent diffusion bonding of the chip to the wafer.

8 Claims, 4 Drawing Sheets

(52) U.S. Cl.
CPC .......... *H01L 24/13* (2013.01); *H01L 25/0657* (2013.01); *H01L 25/50* (2013.01); *H01L 2224/0345* (2013.01); *H01L 2224/0401* (2013.01); *H01L 2224/05147* (2013.01); *H01L 2224/11462* (2013.01); *H01L 2224/11464* (2013.01); *H01L 2224/13026* (2013.01); *H01L 2224/13147* (2013.01); *H01L 2224/13562* (2013.01); *H01L 2224/13611* (2013.01); *H01L 2224/16225* (2013.01); *H01L 2224/81* (2013.01); *H01L 2224/81022* (2013.01); *H01L 2224/8181* (2013.01); *H01L 2224/8182* (2013.01); *H01L 2224/81099* (2013.01); *H01L 2225/06513* (2013.01)

(58) Field of Classification Search
CPC ... H01L 2224/11464; H01L 2224/8181; H01L 2224/0345; H01L 2224/0401; H01L 2224/13026; H01L 2224/81022; H01L 2225/06513; H01L 2224/81
See application file for complete search history.

(56) References Cited

U.S. PATENT DOCUMENTS

| | | | | |
|---|---|---|---|---|
| 2005/0003652 | A1* | 1/2005 | Ramanathan | H01L 24/11 438/616 |
| 2006/0220259 | A1* | 10/2006 | Chen | H01L 21/563 257/778 |
| 2006/0223231 | A1* | 10/2006 | Koiwa | C09J 5/06 438/108 |
| 2009/0186425 | A1* | 7/2009 | Mizukoshi | H01L 21/4853 438/7 |
| 2009/0302469 | A1 | 12/2009 | Masuda et al. | |

OTHER PUBLICATIONS

Written Opinion for PCT/SG2015/050173, 4 pages (dated Sep. 7, 2017).

* cited by examiner

- Bonding is mainly done by Cu-Cu (or Al-Al) diffusionn bonding
- Solder gets diffused into Cu
- No visible Cu-Sn intermetallic layer

METHOD FOR BONDING A CHIP TO A WAFER

CROSS REFERENCE TO RELATED APPLICATIONS

This patent application is a National Stage Entry of International Patent Application No. PCT/SG2015/050173, filed on Jun. 22, 2015, which claims the benefit of priority of Singapore patent application No. 10201403487P, filed on Jun. 20, 2014, the contents of each of which are hereby incorporated by reference in their entirety for all purposes herein.

TECHNICAL FIELD

The present disclosure provides a method for bonding one or more chips to a wafer.

BACKGROUND ART

Using conventional methodologies, a chip on wafer (CoW) bonding process involves the formation of copper (Cu) pillars on either the chip or the wafer, or both, before the chip is bonded to the wafer. If one of the chip and wafer does not include Cu pillars, it is instead provided with a Cu pad for bonding to the Cu pillars of the other of the chip and wafer. For simplicity, the following discussion will be limited to arrangements where there are pairs of opposing Cu pillars—i.e. the chip and wafer each have Cu pillars, with each Cu pillar of the chip aligning with a unique Cu pillar of the wafer—though the same discussion applies when bonding a Cu pillar to a Cu pad.

Each Cu pillar consists of a Cu post and a solder cap. The solder cap is typically applied using electroplating, followed by a reflow process to round the cap. During bonding, the solder caps of the chip melt and react with solder caps of the wafer to permanently fix the chip to the wafer.

The Cu pillars vary in height. This is the result of variance in the height of the Cu post and, or alternatively, the solder cap. As a consequence, thick solder caps are used, since solder deforms easily when melted, and pressure is usually applied to urge the chip against the wafer to ensure each Cu pillar meets and bonds with an opposing Cu pillar. This pressure can squeeze solder between the opposing Cu pillars. If the solder volume is large and the separation between Cu pillars (the "pitch") is small, spreading solder can bridge neighbouring Cu pillars.

Despite this, there are many reasons why thick solder caps are considered unavoidable in conventional CoW processes. Flip chip bonding—a process that can permanently bond a chip to a wafer in a single step—requires thick solder caps to ensure there is sufficient solder on each of the chip and wafer so that opposing Cu pillars can bond through formation of an intermetallic alloy between the opposing pillars.

In addition, a thick solder cap is considered useful since the solder of a Cu pillar diffuses into the Cu post at elevated temperatures. This diffusion reduces the amount of available solder for the bonding process. Also, to form a smooth solder cap using a reflow process—the smoothness being necessary to ensure proper bonding and to reduce the impact of Cu pillar height variation—a relative thick minimum thickness is usually required.

It would be useful to provide a method that avoids the need for the thick solder caps, and thereby mitigates the potential for bridging.

SUMMARY OF INVENTION

The present invention provides a method for chip on wafer bonding, comprising forming a plurality of posts on at least one of a chip and a wafer, and a like plurality of contacts on the other of the chip and the wafer; planarizing a contact surface of each post, the planarized contact surface having a surface roughness height; applying, to at least one of the chip and the wafer, a bonding material of a thickness no greater than the surface roughness height; temporarily bonding the posts to the contacts using the bonding material to stabilize a position of the chip relative to the wafer for permanent diffusion bonding of the chip to the wafer.

The method may further include the step of permanently bonding the chip to the wafer by diffusion of the posts and contacts into each other.

The present invention also provides an integrated chip formed using the method described above.

The term "surface roughness height", and similar, refer to the difference in height between the lowest point on a surface and the highest point on the surface. In the present case, the lowest point of a contact surface of a post on a wafer or chip is the point on that contact surface that is closest to the wafer or chip. Conversely, the highest point of a contact surface of a post on a wafer or chip is the point on that contact surface that is furthest from the wafer or chip.

The term "temporary integrated chip" refers to a chip and wafer that have been temporarily bonded in advance of being permanently bonded.

The term "temporarily bonding", "temporarily bonded", and similar, refer to a condition in which the contact surface of a post is only partially bonded to an opposing contact. In other words, across the contact surface of the post there are regions in which the post is bonded to the opposing contact and regions where it is not, such that a reliable electrical connection has not been formed.

The term "opposing contact", "opposing post", and similar, identify, for a post or contact on one of the chip and wafer, the post or contact on the other of the chip and wafer to which it will be bonded.

The term "contact surface" refers to the surface of a contact (e.g. a post) that is to be bonded to an opposing contact.

The phrase "do not oxidise", and similar, when used in the context of the oxidation of contacts or posts, means that for the time up to when the contacts or posts are bonded with opposing contacts, the contact surfaces or posts remain substantially unoxidised.

The term "low melting point metal", and similar, will be understood to mean a metal having a lower melting point than the material from which the contacts of the chip and wafer are fabricated. In embodiments described herein, the contacts are formed from Cu, aluminium (Al) or gold (Au), and the bonding material is formed from a lower melting point metal such as tin (Sn), indium (In), lead (Pb) or bismuth (Bi).

BRIEF DESCRIPTION OF DRAWINGS

Some embodiments of the present method will now be described, by way of non-limiting example only, with reference to the accompanying drawings in which.

DESCRIPTION OF EMBODIMENTS

Described herein is one of a variety of methods for forming contacts, presently posts, on a wafer. It will be appreciated that similar teachings apply to the formation of posts on a chip.

Figure 1:
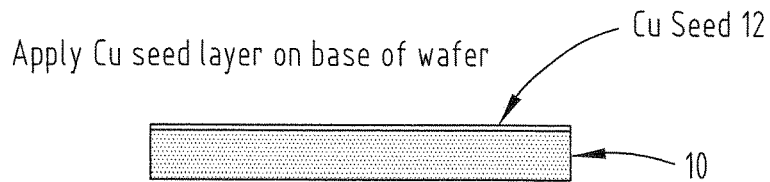
FIG. 1 is a side view of a wafer on which a Cu seed layer has been deposited.

A method for forming posts on a wafer is shown in FIGS. 1 to 6. FIG. 1 shows a wafer 10. An electrically conductive material seed layer 12 is deposited onto the wafer 10. The wafer 10 is formed from silicon. However, any other appropriate material may be used, such as germanium.

Deposition of the seed layer 12 is performed using physical vapour deposition (PVD). This process produces very smooth layer of electrically conductive material having a surface roughness height of around 1 nm. The electrically conductive material deposited by the PVD process may be Cu, Al, Au or any other appropriate material. The present seed layer 12 is formed from Cu.

Figure 2:
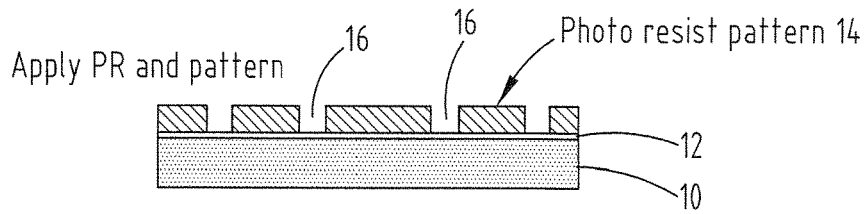
FIG. 2 is a side view of the wafer of FIG. 1, with a photoresist layer in place.

After the seed layer 12 has been deposited a photoresist 14 is laid over the seed layer 12 as shown in FIG. 2. The photoresist 14 is patterned with the apertures 16 defining the positions where posts will be formed on the wafer 10.

Figure 3:
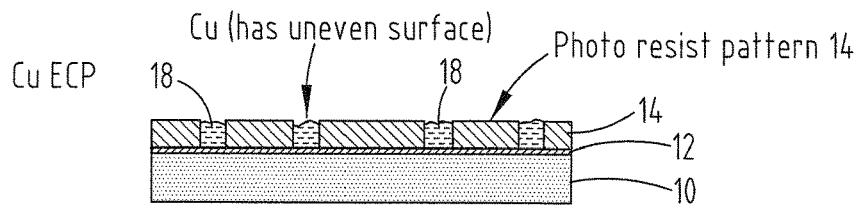
FIG. 3 is a side view of the wafer of FIG. 2, after post deposition.

Posts 18 are then formed on the exposed portions of the seed layer 12, through the patterned photoresist 14, as shown in FIG. 3. The present posts 18 are formed using an electroplating process.

The posts 18 comprise the same electrically conductive material as the seed layer 12. Thus in the present embodiment, the posts 18 are formed from Cu. While different metals can be used for the seed layer 12 and posts 18, using the same metals is useful. This ensures the melting point of the metals is the same and reduces the likelihood of galvanic corrosion.

The posts 18 have irregular surfaces and dissimilar heights after electroplating. In prior art CoW bonding methods, this is one of the primary reasons for applying a thick layer of solder on the posts so that there is sufficient solder on each post for solder reflow to form a smooth cap.

In this manner, posts may be formed on either the chip and wafer or, in some embodiments, on both the chip and wafer.

The posts 18 then undergo planarization. The planarization process results in a highly polished or planar contact surface on each of the posts 18.

Planarization can be achieved using any process providing an appropriate low surface roughness (e.g. less than 20 nm). Some relevant processes involve chemical-mechanical planarization (CMP) of the top surfaces 20 of the posts 18 using a CMP device (not shown). CMP can yield a surface roughness as low as 1 nm. An different relevant process is bit grinding. Bit grinding can yield a surface roughness in the range of about 15 to 20 nm. A further relevant process is dry polishing. Dry polishing can yield a surface roughness in the range of about 15 to 20 nm. Whichever appropriate planarization process is adopted, it can be useful for the photoresist 14 to remain in place during planarization to reduce the likelihood of damage to the posts 18 resulting from lateral forces (i.e. forces applied parallel to the plane of the top surface 20) applied to the posts 18 (e.g. for a CMP process, lateral force may be applied by the carrier or chuck of the CMP device). In this circumstance, the photoresist 14 provides lateral support to the posts 18 to counteract lateral forces applied during planarization. Accordingly, in the present embodiment, planarization occurs while the photoresist 14 is in place on the seed layer 12.

Figure 4:
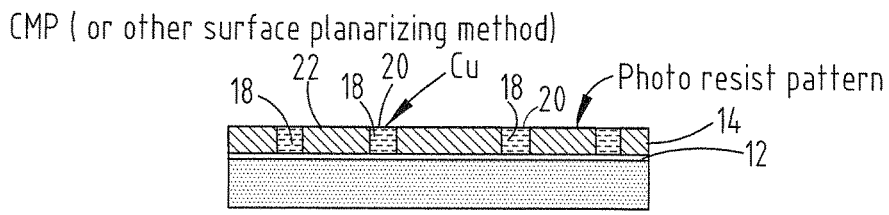
FIG. 4 is a side view of the wafer of FIG. 3, after planarization.

Planarization removes material from the posts 18 until a desired height of the posts 18 is reached. The desired height will usually be the lowest part of the top surface 20—in other words, the part of the contact surface closest to the wafer 10 before planarization—or lower. Electroplating often results in the lowest part of the top surface 20 being within the aperture 16 of the photoresist 14—in other words, below the exposed surface of the photoresist 14. It is therefore usually necessary to also remove part of the photoresist 14 down to the desired height of the posts 18 after planarization, as shown in FIG. 4 in which the photoresist 14 and posts 18 have undergone planarization until they form a substantially continuous, planar surface 22. Thus planarization also results in uniform height of the posts 18 across the wafer. The uniformity in post height reduces the likelihood that chips will drift under applied pressure during subsequent permanent bonding.

The top surface 20 is a contact surface that, after planarization, becomes better suited to contacting an opposing contact on the chip during CoW bonding according to the methods described herein. The contact surface 20 will be substantially planar with a surface roughness height (i.e. the difference in height of the post 18 at the lowest point of the contact surface 20 when compared with the highest point of the contact surface 20) of less than 20 nm.

Figure 5:
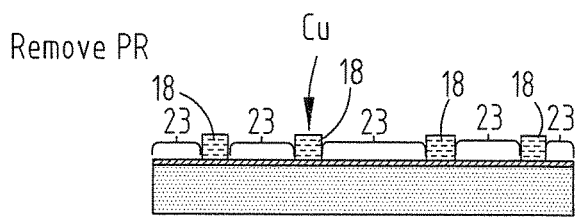
FIG. 5 is a side view of the wafer of FIG. 4, after removal of the photoresist layer.
Figure 6:
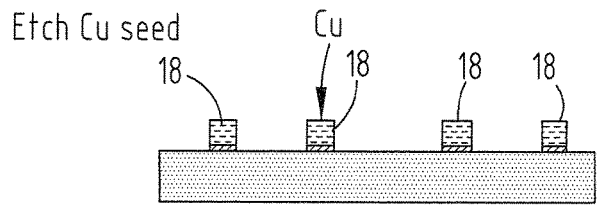
FIG. 6 is a side view of the wafer of FIG. 5, after etching.

The photoresist layer 14 is then removed, leaving behind the Cu posts 18 on the seed layer 12 as shown in FIG. 5. Regions 23 of the seed layer 12 are then removed using a known process, such as chemical etching, to produce electrically isolated Cu posts 18 as shown in FIG. 6.

Figure 8:
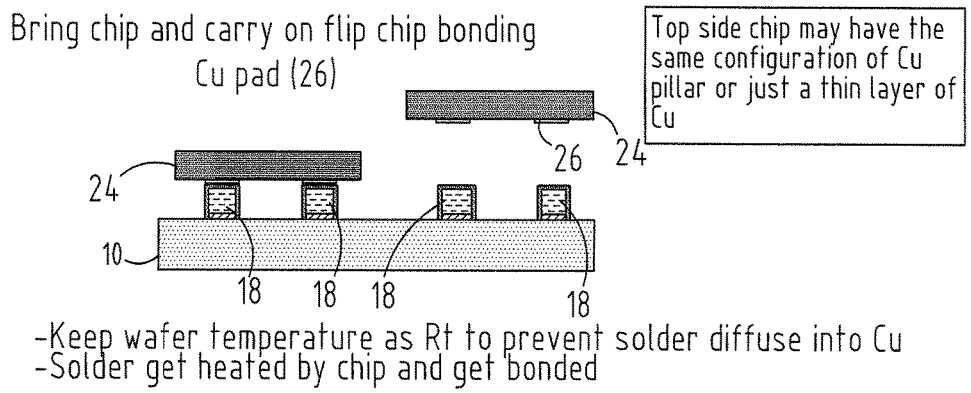
FIG. 8 is a side view of the wafer of FIG. 7, with a first chip in register with some of the posts on the wafer and a second chip being brought into register with other posts on the wafer.
Figure 9:
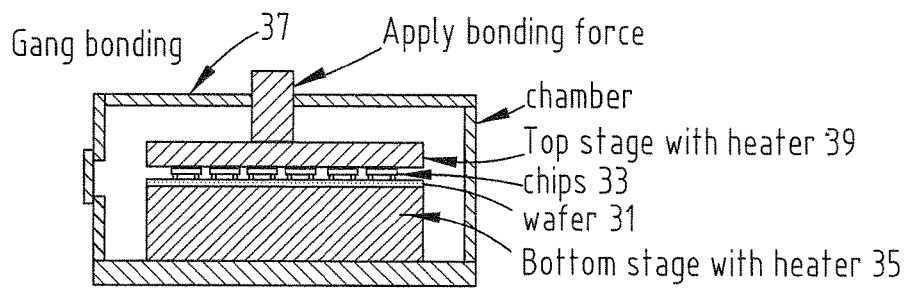
FIG. 9 is a side, cross-sectional view of a gang bonder with a single wafer in position on the bottom stage, ready for permanent bonding with multiple chips.

The chip is also provided with contacts. Typically, for a plurality of posts 18 a like plurality of contacts will be provided, one contact will for each post 18. The like plurality of contacts are arranged in a mirror-image configuration to the posts 18 such that the posts 18 and contacts align upon inversion of the chip onto the wafer 10 for bonding. Also, where multiple chips are to be bonded to the same wafer, each chip will include contacts arranged in a mirror image of a subset of the posts on the wafer, as shown in FIG. 8.

The contacts on the chip may be posts such as those formed on the wafer 10. Alternatively, the chip 24 may include a different types of contacts, such as pads 26, as shown in FIG. 8. Where the chip 24 includes pads 26, the pads 26 may be formed by any appropriate method such as PVD and patterning through photoresist, followed by etching. A PVD process can be useful since it provides a highly smooth surface, with a surface roughness height of around 1 nm. The highly smooth surface improves the surface area for bonding and lowers the required bonding force during permanent bonding, when compared with a less smooth surface.

Figure 7:
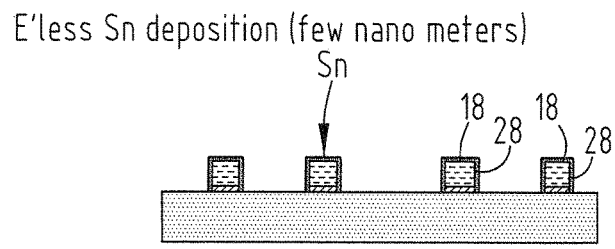
FIG. 7 is a side view of the wafer of FIG. 6, after bonding material deposition.

After formation of the posts 18, bonding material 28 is applied to the posts 18 as shown in FIG. 7. The amount of bonding material is only that which is necessary to achieve a temporary CoW bond to ensure alignment of the chip and wafer during subsequent global or gang bonding.

It is desirable that the bonding material 28 be applied very shortly after planarization to reduce oxidation of the contact surfaces 20 of the posts 18—here, "very shortly" means before oxidation of the contact surfaces 20. If the contact surfaces 20 oxidise after planarization, the contact surfaces 20 can be de-oxidised immediately before application of the bonding material 28. Removing surface oxidation lowers the bonding temperature and thereby reduces the likelihood that the bonding material will diffuse into the posts 18. For example, in order to achieve Cu—Cu diffusion bonding between oxidised contact surfaces may require a temperature of around 350 degrees Celsius, whereas those same surface may undergo Cu—Cu diffusion bonding at temperatures as low as 200 degrees Celsius when de-oxidised.

In a first embodiment, as shown in FIG. 6, bonding material, presently tin (Sn) solder 28, is deposited onto the posts 18. The solder 28 is deposited using electroless electroplating, though other techniques may be used. Similarly, another low melting point metal may be used in place of Sn.

The bonding material 28 is deposited in a thickness no greater than the surface roughness height of the planarized contact surface 20. While the surface height roughness will typically be less than 20 nm, even for rougher surfaces it is desirable that the bonding material thickness remain less than 1 micron. This reduces the likelihood that permanent bonding will be achieved using an intermetallic compound comprising the bonding material.

After application of the bonding material, the posts 18 are temporarily bonded to the contacts 26 using the bonding material to stabilize a position of the chip relative to the wafer 10 for permanent diffusion bonding of the chip to the wafer 10. A flip chip bonder (not shown) is used for this purpose. The flip chip bonder picks up the chip 24 and positions it over the wafer 10 with the pads 26 brought into register (i.e. contact and alignment) with the posts 18. While a single chip 24 may be positioned over the wafer 10 by the flip chip bonder, the embodiment shown in FIG. 8 provides two chips 24 and it will be understood that the present methodology can be applied in cases where even three or more chips 24 are temporarily bonded to the wafer 10 before being permanently bonded to the wafer 10 in a subsequent bonding step.

The chip 24 is heated so that the solder 28 melts and tacks (i.e. temporarily bonds) the pads 26 to the posts 18 and thereby pads chip 24 to the wafer 10. The chip 24 may be heated in advance of it being brought into register with the wafer 10. However, this may result in oxidation of the Cu pads 26. It is therefore usually preferable that the chip 24 be heated once brought into register with the wafer 10.

In the present embodiment, the thickness of the Sn solder 28 is equal to or less than the surface roughness height of the contact surfaces 20. Also, heating of the chip 24 is not sufficient to melt the Cu pads 26, and the wafer 10 and Cu posts 18 are not directly heated at all, though some heat will transfer to the posts 18 from the chip. Given the pads 26 and contact surface 20 do not melt, the remaining surface roughness of the pads 26 and contact surfaces 20 will prevent them from being bonded across the full contact surfaces 20 of the posts 18. In other words, the temporary bonding of the chip to the wafer involves tacking the chip to the wafer at a number of regions across the contact surfaces 20, but not across the entirety of the contact surfaces 20.

Notably, the solder bonding material 28 is not intended to be of sufficient thickness to permanently bond the chip 24 to the wafer 10. However, Sn is still useful for temporarily bonding the chip 24 to the wafer 10 in a flip chip bonder, in advance of permanent bonding. It is therefore undesirable that the Sn solder 28 diffuse into the Cu posts 18 before temporary bonding is achieved.

To reduce diffusion of the Sn solder 28 into the Cu posts 18, the wafer 10 is maintained at a temperature lower than the melting point of the bonding material during temporary bonding—in other words, at a temperature lower than the melting point of Sn in the present example. At lower temperatures the oxidation of the contact surfaces 20 is also reduced. In the embodiment shown in FIG. 8, the wafer 10 is maintained at room temperature. Thus, the solder 28 remains solid until the heated chip 24 brings it to melting temperature at which point it rapidly, temporarily bonds the chip 24 to the wafer 26. Since the solder 28 is Sn, and Sn melts quickly over around 240 degrees Celsius, temporary tacking or bonding of the chip to the wafer can be carried out in a few seconds.

Shortly after the solder 28 is melted the chip 24 ceases to be heated. The flip chip bonder may thereafter cool the chip 24 to bring the solder 28 back down below melting point. In an ideal scenario the solder 28 will melt and bond the chip 24 to the wafer 10 substantially without diffusing into either of the posts 18 or pads 26.

In this manner a temporary integrated chip 30 is formed form the chip 24 and wafer 10 to which the chip 24 is temporarily bonded.

It will be understood that bonding material can similarly be applied to the chip as well as, or alternatively to, the wafer. However, since the present embodiment intends to provide only sufficient bonding material to temporarily bond the chip to the wafer to enable permanent bonding by diffusion of the posts and pads into each other, it is generally desirable that the bonding material be applied to only one of the chip and wafer.

Figure 10:
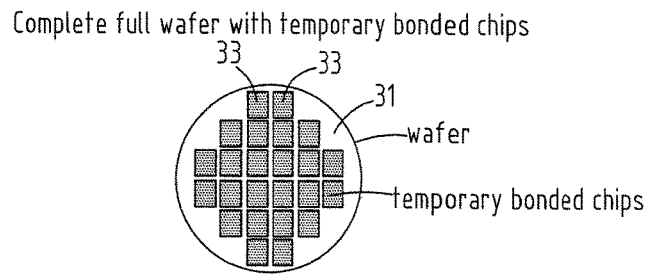
FIG. 10 is a plan view of a full wafer to which a number of chips have been temporarily bonded.

Upon completion of the temporary bonding process the product of the temporary bonding process (e.g. the temporary integrated chip, or a wafer 31 to which multiple chips 33 have been temporarily bonded—see also FIG. 10) is placed on a bottom stage 35 of a gang or global bonder 37, though other types of bonder may be used. The temporary integrated chip, or wafer with multiple chips, is then vacuumed (to remove volatile gases) and, subsequently, a top stage 39 presses and applies force to the chip or chips.

The top and bottom stages are then heated to a suitable temperature for permanent bonding. This heat should be sufficient to cause the Cu posts 18 to diffuse into the Cu pads 26 and vice versa, achieving permanent bonding. This temperature should be less than the melting temperature of the material (e.g. Cu) from which the posts 18 and pads 26 are formed. The temperature needed will depend on the level of oxidation of the Cu contact surfaces 20 and the pad 26. Usually, a temperature in the range of 100 degrees Celsius to 250 degrees Celsius is sufficient to achieve permanent bonding substantially by Cu—Cu diffusion.

Figure 11:
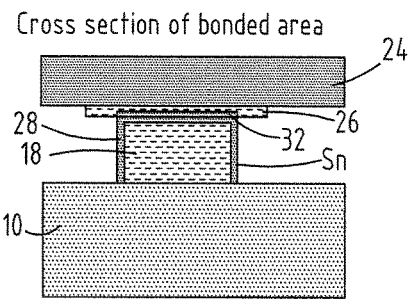
FIG. 11 is a side, close-up view of a bonding region between a post and pad.

It will be appreciated that the presence of some Sn in the bonding region will result in the creation of an intermetallic compound in the bonded region 32 during permanent bonding, as shown in FIG. 11. However, in accordance with the present methods, the amount of bonding material, and the resultant amount of intermetallic compound, is insufficient for reliable, permanent CoW bonding.

Pressure may be applied during either or both of the temporary and permanent bonding steps. The pressure ensures appropriate contact between each of the posts 18 and the pads 26 to account for any variations in the height of posts 18—these variations will be very minor due to planarization. Flip chip bonding and global wafer bonding techniques will be understood in the art. Other bonding techniques (e.g. heated air bonding) will be similarly understood as applicable to the present methods.

In a second embodiment, after regions of the Cu seed layer have been etched to complete formation of the posts, an electroless solvent is used to temporarily bond the chip to the wafer.

Figure 12:
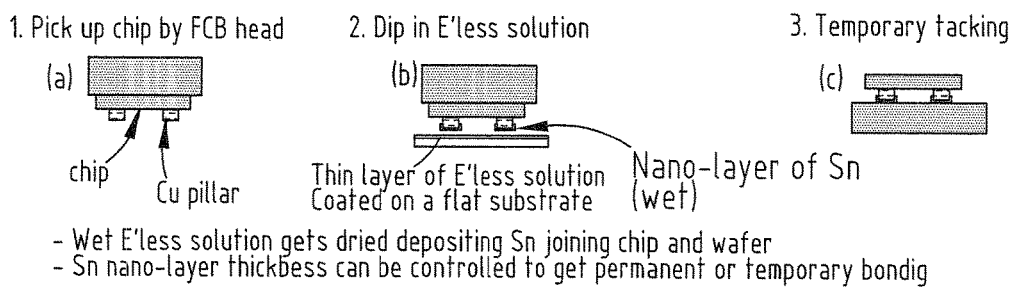
FIGS. 12(a), 12(b) and 12(c) show progressive steps of a flip chip bonder picking up a chip, dipping it in an electroless solvent bath and then bringing the chip into register with a wafer.

With reference to FIGS. 12(a), 12(b) and 12(c), to deposit the solvent onto the contacts 38 of a chip 40, a solvent bath or tray 50 containing electroless solvent is positioned between chip pick up and bonding in the flip chip bonder. During temporary bonding, the flip chip bonder picks up the chip 40 (see FIG. 12(a)) and dips it in the electroless solvent bath 50 (see FIG. 12(b)) to coat the contacts 38 (e.g. pads or posts) with solvent 41. While the solvent is wet the chip 40 is brought into register with the wafer 42 (see FIG. 12(c)). By contacting the chip 40 to the wafer 42, and ideally pressing the chip 40 to the wafer 42, solvent from the contacts 38 of the chip 40 flows onto, and coats, the contacts 44 of the wafer 42. In this manner the solvent fills between the contact surfaces 46, 48 of the contacts 38, 44.

Figure 13:
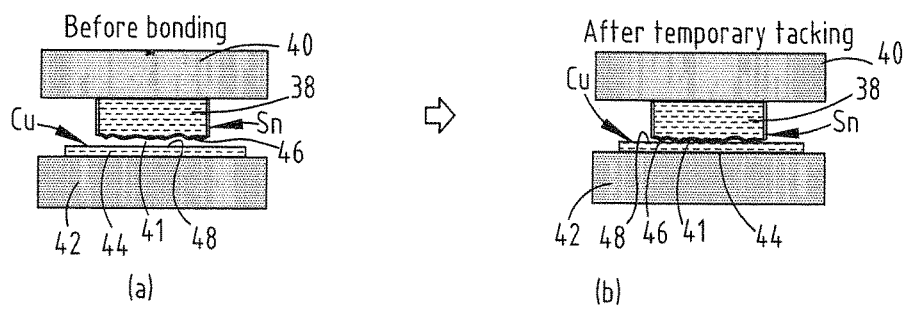
FIGS. 13(a) and 13(b) show before and after illustrations of a chip and wafer being temporarily bonded using an electroless solvent.
Figure 14:
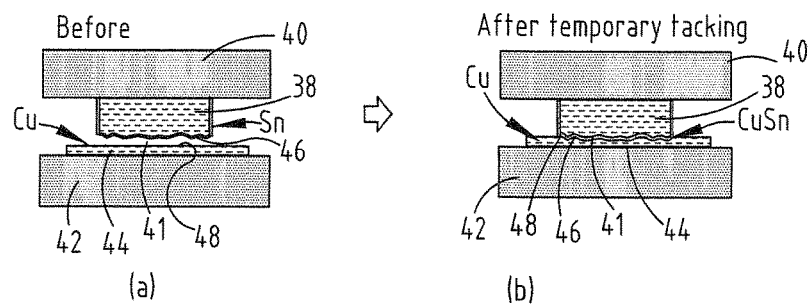
FIGS. 14(a) and 14(b) show before and after illustrations of a chip and wafer being temporarily bonded using an electroless solvent with eutectic bonding to achieve temporary bonding of the chip to the wafer.

The electroless solvent 41 reacts with the contacts, 38, 44 to form Sn between them. The process hereafter depends on the amount of electroless solvent deposited on the contacts 38. As shown in FIGS. 14(a) and 14(b), where a thicker layer of electroless solvent 41 is deposited (e.g. 100 nm to 1 micron thick) the amount of metal, such as Sn, formed between the contacts 38, 44 can be sufficient for temporary bonding. In other words, eutectic bonding is used to temporarily bond the chip 40 to the wafer 42. Thus permanent bonding can be achieved in a flip chip bonder, or alternatively in a gang or global bonder if desired. Where the thickness of the electroless solvent is lower (e.g. less than 100 nm), as shown in FIGS. 13(a) and 13(b), the metal formed between the contacts 38, 44 should still be heated to forge the necessary temporary bond between the contacts 38, 44. Accordingly, for thinner layers of electroless solvent the chip 40 is brought into register with the wafer 42 using a flip chip bonder. The chip 40 is then heated, and the wafer 42 held at a lower temperature, as described above to temporarily bond the chip 40 to the wafer 42. After temporary bonding the temporary integrated chip (comprising chip 40 and wafer 42 temporarily bonded together) is moved to a global or gang bonder as described above, and permeant bonding takes place.

In both cases using electroless solvent the metal layer ultimately produced is markedly thinner than in conventional CoW bonding techniques. Similar to the thin electroplated layer of Sn of the previous embodiment, by using only a thin electroless solvent layer (e.g. less than 1 micron thick) only temporary bonding is possible using the Sn formed by the solvent react with the posts and contacts. This enables permanent bonding to result predominantly from Cu—Cu or Al—Al diffusion of the posts 18 into the contacts 32 and vice versa.

The electroless solvent layer may be 10 μm thick. The thickness can be adjusted by adjusting the depth of solvent in the solvent bath. To achieve a low thickness the solvent can be coated into the bath using a roller between successive chip coating steps.

It will be noted that the present methods use very little bonding material to bond the chip to the wafer. The amount of bonding material is in general only that which is necessary to temporarily bond, or tack, the chip to the wafer to ensure alignment during permanent bonding. Permanent bonding is achieved by metal-metal (e.g. Cu—Cu or Al—Al) diffusion of the posts on one of the chip and wafer into the contacts on the other of the chip and wafer.

Figure 15:
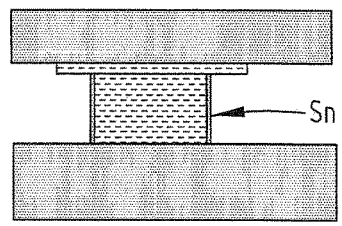
FIG. 15 shows a close-up view of a bonding region between a post and pad resulting from use of electroless solvent as a bonding material for temporary bonding.

Due to the use of very little bonding material, there is a far lower risk of bridging between neighbouring posts when compared with conventional CoW bonding techniques. In some cases, the bonding material can be vapourised during diffusion of the chip and wafer contacts into each other. In other cases, the bonding material may be diffused into the posts or contacts (e.g. into Cu) which, in light of the minimal bonding material employed during temporary bonding, becomes practically undetectable and has negligible influence on permanent bonding—the permanent bonding in this circumstance remains substantially reliant on post/contact diffusion. This is illustrated in FIG. 15, which shows the ideal scenario in which no bonding material (e.g. solder) protrudes from between the contacts after bonding. Thus the pitch (centre to centre distance between the closest posts on a chip or wafer) can be substantially reduced. For example, for a Cu post diameter in the range of 0.1 μm to 50 μm, and a post height of 0.1 μm to 50 μm, the pitch may be 0.2 μm to 100 μm. In such cases, the Sn bonding material thickness may be 0.5 nm to 100 nm. As such, a post diameter of 0.1 μm may be able to achieve a pitch of 0.2 μm with a Sn thickness of 0.5 nm and, similarly, a post diameter of 50 μm may be able to achieve a pitch of 100 μm with a Sn thickness of 100 nm.

The embodiments described herein have been cast in the context of a chip being bonded to a wafer, with the wafer providing the posts and the chip providing opposing contacts. It will be appreciated that the same teachings apply to a scenario in which the chip provides the posts and the wafer provides the contacts, or in which both the chip and wafer provide posts.

The invention claimed is:
1. A method for chip on wafer bonding, comprising:
   forming posts on a wafer;
   forming contacts on a chip such that the posts and the contacts align upon inversion of the chip onto the wafer;
   planarizing each of the posts to have a contact surface with a surface roughness height less than 20 nanometers;

depositing, to the contact surface of the posts, a bonding material with a thickness not greater than the surface roughness height of the contact surface; and temporarily bonding the posts to the contacts using the bonding material to stabilize a position of the chip relative to the wafer before subsequently permanently diffusion bonding of the chip to the wafer, wherein the surface roughness height is a difference in height between a lowest point on a surface of the contact surface and a highest point on the surface of the contact surface.

2. The method of claim 1 further comprising:

reducing a likelihood that permanent bonding occurs between the posts and the contacts by depositing the thickness of the bonding material to be less than 1 micron.

3. The method of claim 1 further comprising:

bringing the chip into register with the wafer; and heating, after the chip is brought into register with the wafer, the chip to melt the bonding material and temporarily bond the posts to the contacts.

4. The method of claim 1 further comprising:

tacking the contact surface of the posts of the wafer to the contacts of the chip to achieve the temporarily bonding of the chip to the wafer at a number of regions across the contact surface of the posts but not across an entirety of the contact surface of the posts.

5. The method of claim 1 further comprising:

temporary bonding the chip to the wafer by heating the chip to melt the bonding material but not melt the posts and the contacts to prevent the posts and contacts from being bonded across an entirety of the contact surface.

6. The method of claim 1 further comprising:

reducing, during temporary bonding of the posts to the contacts, diffusion of the bonding material into the posts by maintaining the wafer at a temperature lower than a melting point of the bonding material.

7. The method of claim 1 further comprising:

reducing a likelihood that the bonding material diffuses into the posts during temporary bonding of the posts to the contacts by depositing the bonding material to the contact surface of the posts before oxidation of the posts occurs.

8. The method of claim 1 further comprising:

heating, after completion of temporary bonding the posts to the contacts, the wafer and the chip such that the posts and the contacts diffuse into each other and permanently bond together.

* * * * *